(12) United States Patent
Marriott

(10) Patent No.: US 8,791,687 B2
(45) Date of Patent: Jul. 29, 2014

(54) TRANSFORMER CORRECTION CIRCUIT AND TECHNIQUE FOR REDUCING CROSS-TALK CURRENT

(75) Inventor: Joe E. Marriott, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 244 days.

(21) Appl. No.: 13/480,007

(22) Filed: May 24, 2012

(65) Prior Publication Data

US 2013/0314071 A1    Nov. 28, 2013

(51) Int. Cl.
 *H01F 27/42* (2006.01)

(52) U.S. Cl.
 USPC ........................................ 323/356; 336/84 C

(58) Field of Classification Search
 CPC ..... H01F 27/427; H01F 38/32; H01F 27/362; H02M 1/12; A61B 5/055; G01B 7/105
 USPC .................. 323/247, 250, 251, 254, 35, 335; 363/16–20, 21.01, 56.02, 126, 134, 24; 336/59, 70, 69, 170, 172, 155, 84 C, 336/84 R, 178, 180
 See application file for complete search history.

(56) References Cited

U.S. PATENT DOCUMENTS

| | | | |
|---|---|---|---|
| 3,963,975 A | 6/1976 | Gauper, Jr. et al. | |
| 4,507,721 A | 3/1985 | Yamano et al. | |
| 4,890,630 A * | 1/1990 | Kroll et al. | 600/508 |
| 5,181,026 A * | 1/1993 | Granville | 340/870.28 |
| 6,373,360 B1 * | 4/2002 | Miyamoto et al. | 335/210 |
| 7,256,638 B2 * | 8/2007 | Vice | 327/531 |
| 7,710,085 B2 * | 5/2010 | Park et al. | 323/251 |

* cited by examiner

Primary Examiner — Rajnikant Patel

(57) ABSTRACT

An apparatus and technique that reduces induced cross-talk current between transformer windings. The apparatus includes a transformer having a first secondary winding that provides a first voltage relative to earth ground, a second secondary winding that provides a second voltage relative to floating ground, and a shield disposed between the first and second secondary windings. A correction circuit connected to the first secondary winding is configured to generate a correction voltage. The correction voltage drives a shield to induce a correction current into the second secondary winding to reduce cross-talk current induced between the first and second secondary windings.

26 Claims, 2 Drawing Sheets

TRANSFORMER CORRECTION CIRCUIT AND TECHNIQUE FOR REDUCING CROSS-TALK CURRENT

BACKGROUND

Digital multi-meters (DMMs) typically may be powered by mains voltage and may include floating circuitry configured for floating measurement. DMMs typically include a transformer that powers the floating circuitry. However, the existence of a voltage difference between the secondary windings of the transformer may induce undesired current flow into the floating circuitry, degrading the quality of DMM measurements. There is therefore a need to reduce undesired current flow between transformer windings in devices powered by mains voltage.

SUMMARY

In a representative embodiment, an apparatus includes a transformer having a primary winding, a first secondary winding configured to provide a first voltage responsive to a voltage applied to the primary winding, and a second secondary winding configured to provide a second voltage responsive to the voltage applied to the primary winding; a shield between the first and second secondary windings; and a correction circuit configured to generate a correction voltage responsive to the first voltage, wherein the correction voltage drives the shield to reduce cross-talk current induced between the first and second secondary windings.

In a further representative embodiment, an apparatus includes a transformer having a primary winding, a first secondary winding configured to provide a first complex waveform voltage responsive to a voltage applied to the primary winding, and a second secondary winding configured to provide a second complex waveform voltage responsive to the voltage applied to the primary winding; a shield between the first secondary winding and the second secondary winding; and a correction circuit configured to generate a correction waveform voltage, wherein the correction waveform voltage drives the shield to induce a correction current in the second secondary winding to substantially cancel cross-talk current induced between the first and second secondary windings.

In another further representative embodiment, in a method for providing a correction circuit for a transformer, the transformer includes a primary winding, a first secondary winding, a second secondary winding, and a shield configurable to induce a current into the second secondary winding. The method includes generating a first voltage from the first secondary winding and a second voltage from the second secondary winding, in response to application of a voltage to the primary winding; measuring cross-talk current induced between the first and second secondary windings; and configuring at least one component of the correction circuit based on the measured cross-talk current, the correction circuit being configured to receive the first voltage, wherein the correction circuit is configured to provide a drive voltage that drives the shield in response to the first voltage to induce a correction current in the second secondary winding for reducing cross-talk current induced between the first and second secondary windings.

BRIEF DESCRIPTION OF THE DRAWINGS

The illustrative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially reduced" means that one skilled in the art would consider the reduction to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
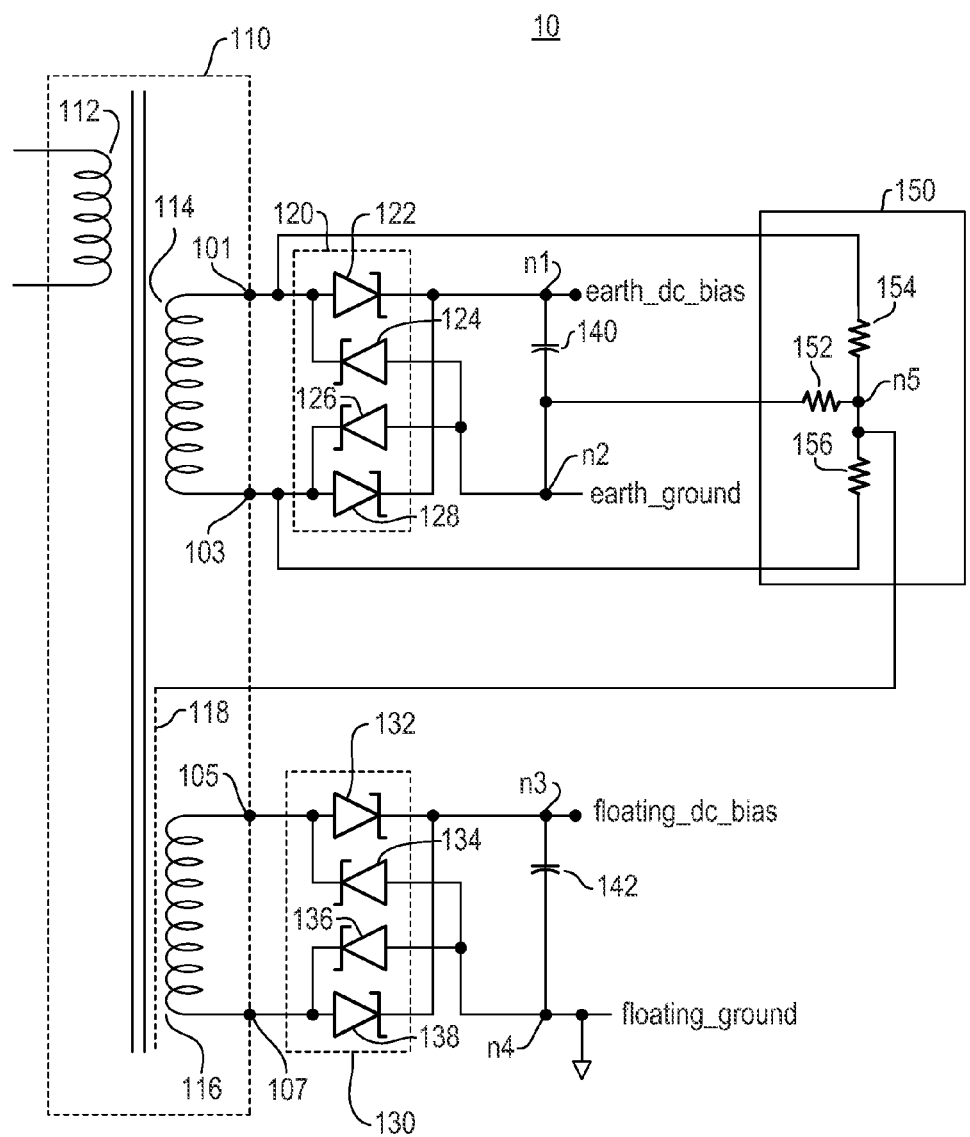
FIG. 1 is a block diagram illustrating an apparatus 10 including a transformer and a correction circuit, according to a representative embodiment.

FIG. 1 is a block diagram illustrating an apparatus 10 including transformer 110 and correction circuit 150, according to a representative embodiment. Transformer 110 includes at least one primary winding 112 connected to the mains voltage or an alternating current (ac) power source (not shown), a first secondary winding 114 and a second secondary winding 116. First secondary winding 114 includes first and second leads (ends) 101 and 103, and is configured to provide a first voltage responsive to the voltage applied to primary winding 112. Second secondary winding 116 includes first and second leads (ends) 105 and 107, and is configured to provide a second voltage responsive to the voltage applied to primary winding 112. First and second leads (ends) 101 and 103, and first and second leads (ends) 105 and 107, may hereinafter be referred to respectively as leads 101, 103, 105 and 107. Transformer 110 further includes shield 118 disposed between first secondary winding 114 and second secondary winding 116. Shield 118 is configured to prevent electrostatic field coupling between first secondary winding 114 and second secondary winding 116, and may include conductive wirings or conductive foils. Transformer 110 may include additional shielding not shown in FIG. 1.

As further illustrated FIG. 1, first full wave bridge rectifier 120 is connected to leads 101 and 103 of first secondary winding 114. First full wave bridge rectifier 120 outputs a rectified voltage (earth_dc_bias) at node n1 relative to earth ground (earth_ground) at node n2. First and second terminals of capacitor 140 are respectively connected to nodes n1 and n2. First full wave bridge rectifier 120 is configured to include diode 122 having an anode and a cathode respectively connected to lead 101 of first secondary winding 114 and node n1, diode 124 having an anode and a cathode respectively connected to node n2 and lead 101 of first secondary winding 114, diode 126 having an anode and a cathode respectively connected to node n2 and lead 103 of first secondary winding 114, and diode 128 having an anode and a cathode respectively connected to lead 103 of first secondary winding 114 and node n1.

Second full wave bridge rectifier 130 is connected to leads 105 and 107 of second secondary winding 116. Second full wave bridge rectifier 130 outputs a rectified voltage (floating_dc_bias) at node n3 relative to floating ground (floating_ground) at node n4. First and second terminals of capacitor 142 are respectively connected to nodes n3 and n4. Second full wave bridge rectifier 130 is configured to include diode 132 having an anode and a cathode respectively connected to lead 105 of second secondary winding 116 and node n3, diode 134 having an anode and a cathode respectively connected to node n4 and lead 105 of second secondary winding 116, diode 136 having an anode and a cathode respectively connected to node n4 and lead 107 of second secondary winding 116, and diode 138 having an anode and a cathode respectively connected to lead 107 of second secondary winding 116 and node n3.

Diodes 122, 124, 126 and 128 of first full wave bridge rectifier 120 are switched into and out of connection with first secondary winding 114 in a conventional manner, responsive to the voltages at leads 101 and 103 of first secondary winding 114 and the voltages at the first and second terminals of capacitor 140. Diodes 122, 124, 126 and 128 of first full wave bridge rectifier 120 are switched so that in a particular half cycle, lead 101 of first secondary winding 114 may be connected to node n1 through diode 122, and lead 103 of first secondary winding 114 may be connected to node n2 through diode 126. In an immediately following half cycle, diodes 122, 124, 126 and 128 of first full wave bridge rectifier 120 are switched so that lead 101 of first secondary winding 114 may be connected to node n2 through diode 124, and lead 103 of first secondary winding 114 may be connected to node n1 through diode 128. As the connections of diodes 122, 124, 126 and 128 are switched as described, first full wave bridge rectifier 120 outputs the rectified voltage (earth_dc_bias) at node n1 relative to earth ground at node n2, responsive to an output of first secondary winding 114. As a further consequence of the switched connection of diodes 122, 124, 126 and 128 as described, a first complex waveform voltage that may be characterized as a half wave rectified voltage is created across leads 101 and 103 of first secondary winding 114 as leads 101 and 103 are alternately clamped to earth ground in successive half cycles. That is, complex waveform voltages that are out of phase with respect to each other are created at each of leads 101 and 103 of first secondary winding 114. Throughout the description that follows, the first voltage and the first complex waveform voltage may be used interchangeably to describe the voltage created at leads 101 and 103 of first secondary winding 114.

Diodes 132, 134, 136 and 138 of second full wave bridge rectifier 130 are switched into and out of connection with second secondary winding 116 in a conventional manner as described above with respect to first full wave bridge rectifier 120, responsive to the voltages at leads 105 and 107 of second secondary winding 116 and the voltages at the first and second terminals of capacitor 142. Diodes 132, 134, 136 and 138 of second full wave bridge rectifier 130 are switched so that in a particular half cycle, lead 105 of second secondary winding 116 may be connected to node n3 through diode 132, and lead 107 of second secondary winding 116 may be connected to node n4 through diode 136. In an immediately following half cycle, diodes 132, 134, 136 and 138 of second full wave bridge rectifier 130 are switched so that lead 105 of second secondary winding 116 may be connected to node n4 through diode 134, and lead 107 of second secondary winding 116 may be connected to node n3 through diode 138. As the connection of diodes 132, 134, 136 and 138 are switched as described, second full wave bridge rectifier 130 outputs the rectified voltage (floating_dc_bias) at node n3 relative to floating ground at node n4, responsive to an output of second secondary winding 116. As a further consequence of the switched connection of diodes 132, 134, 136 and 138 as described, a second complex waveform voltage that may be characterized as a half wave rectified voltage is created across leads 105 and 107 of second secondary winding 116 as leads 105 and 107 are alternately clamped to floating ground in successive half cycles. That is, complex waveform voltages that are out of phase with respect to each other are created at leads 105 and 107 of second secondary winding 116. Throughout the description that follows, the second voltage and the second complex waveform voltage may be used interchangeably to describe the voltage created at leads 105 and 107 of second secondary winding 116.

Since diodes 122, 124, 126 and 128 in first full wave bridge rectifier 120 and diodes 132, 134, 136 and 138 in second full wave bridge rectifier 130 are selected to have similar characteristics, and since capacitors 140 and 142 are selected to have very small ripple voltage, the first complex waveform voltage and the second complex waveform voltage have similar shape. However, although the first and second complex waveform voltages created at first secondary winding 114 and second secondary winding 116 have similar shape, a voltage difference may exist between first secondary winding 114 and second secondary winding 116 due to the different transformer turn ratios in first and second secondary windings 114 and 116 and/or due to loading. Also, inherent internal capacitances may be distributed within transformer 110 between first secondary winding 114 and the transformer core, transformer shielding and primary winding 112. Inherent internal capacitances may likewise be distributed within transformer 110 between second secondary winding 116 and the transformer core, transformer shielding and primary winding 112. These internal inherent capacitances at first and second secondary windings 114 and 116 are different, and combined with the voltage difference between first and second secondary windings 114 and 116 due to the different turn ratios and due to loading, may induce a cross-talk current between first and second secondary windings 114 and 116. The unwanted induced cross-talk current may be injected into an object, device or load that may be electrically in contact with both the earth ground and the floating ground of apparatus 10 shown in FIG. 1

Apparatus 10 shown in FIG. 1 further includes correction circuit 150 connected to first secondary winding 114. In a representative embodiment, correction circuit 150 is configured to include resistor 154 having a first terminal connected to lead 101 of first secondary winding 114 and a second terminal connected to node n5, resistor 152 having a first terminal connected to node n2 and a second terminal connected to node n5, and resistor 156 having a first terminal connected to node n5 and a second terminal connected to lead 103 of first secondary winding 114. In this representative embodiment, correction circuit 150 is configured as a summing circuit to sum the complex waveform voltages at leads (ends) 101 and 103 of first secondary winding 114, to thus generate and output a correction (drive) voltage from node n5 responsive to the first complex waveform voltage created at first secondary winding 114. The respective amounts of contribution of the complex waveform voltages at leads 101 and 103 to the correction voltage may be controlled by selection of the resistance values of resistors 154 and 156. The amplitude of the correction voltage may be controlled by selection of the resistance value of resistor 152. The correction voltage has a waveform shape that is similar to the first and second complex waveform voltages respectively created at first secondary winding 114 and second secondary winding 116. The correction voltage is connected to and drives shield 118, inducing a correction current in second secondary winding 116 to reduce cross-talk current induced between first secondary winding 114 and second secondary winding 116. The amount of correction voltage needed is dependent on the voltage difference between first and second secondary windings 114 and 116 and the different inherent internal capacitances at first and second secondary windings 114 and 116. The correction current induced into second secondary winding 116 decreases the voltage difference between first and second secondary windings 114 and 116 and the different inherent internal capacitances at first and second secondary windings 114 and 116.

Figure 2:
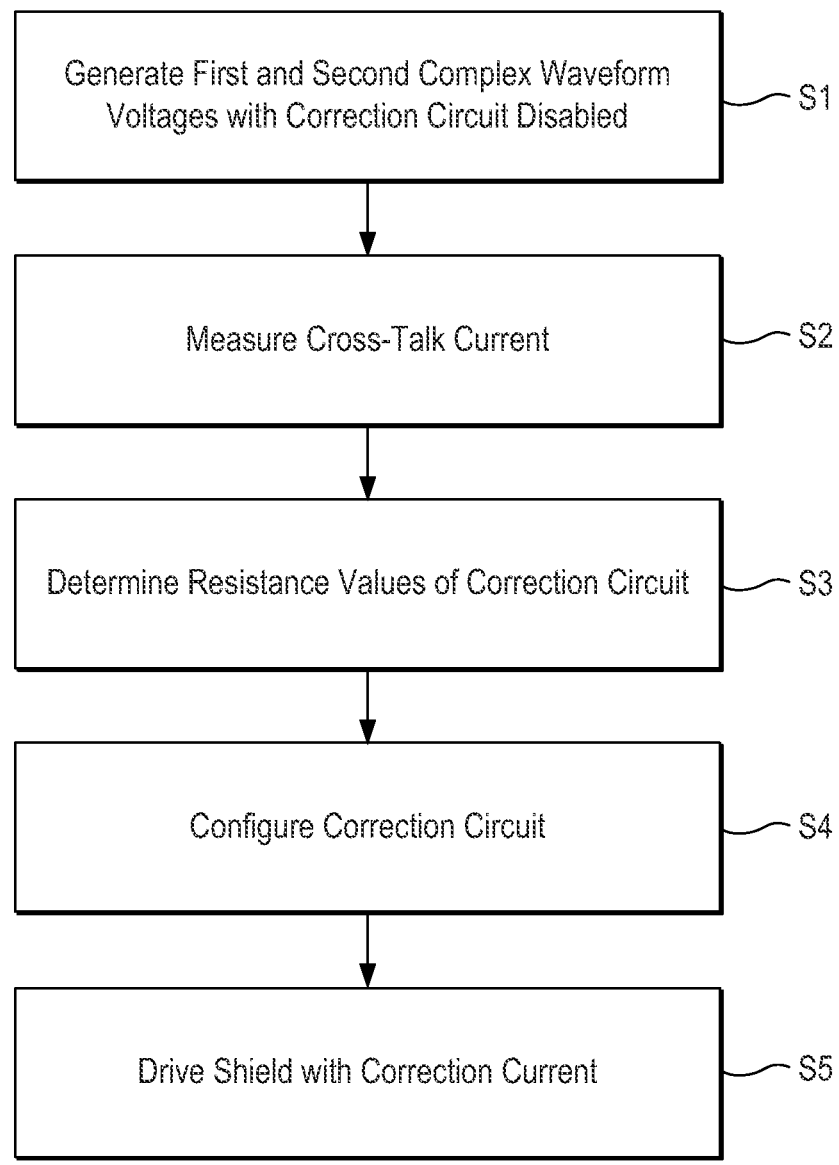
FIG. 2 is a flow chart illustrating a method of configuring correction circuit 150, according to a representative embodiment.

FIG. 2 is a flow chart illustrating a method of configuring correction circuit 150, according to a representative embodiment. The flow chart of FIG. 2 is explanatory of the manner in which correction circuit 150 is configured to provide the correction voltage necessary to reduce the cross-talk current induced between first secondary winding 114 and second secondary winding 116.

In step S1 of FIG. 2, correction circuit 150 of apparatus 10 is first disabled. Correction circuit 150 may be disabled by being shorted to ground at node n2. In a representative embodiment, correction circuit 150 may be disabled by changing resistor 152 to have substantially zero resistance and removing resistors 154 and 156. Primary winding 112 of transformer 110 is then connected to the mains voltage. A first voltage and a second voltage are respectively provided from first secondary winding 114 and second secondary winding 116 responsive to the mains voltage connected to primary winding 112. Responsive to switching of diodes 122, 124, 126 and 128 in first full wave bridge rectifier 120 and switching of diodes 132, 134, 136 and 138 in second full wave bridge rectifier 130, a first complex waveform voltage is created across leads 101 and 103 of first secondary winding 114 and a second complex waveform voltage is created across leads 105 and 107 of second secondary winding 116. Due to the existence of a voltage difference between first secondary winding 114 and second secondary winding 116 as described previously, cross-talk current may be induced between first secondary winding 114 and second secondary winding 116 by capacitive coupling.

In Step S2 of FIG. 2, the cross-talk current induced between first secondary winding 114 and second secondary winding 116 responsive to application of the mains voltage connected to primary winding 112 is measured. The induced cross-talk current flows between earth ground at node n2 and floating ground at node n4 by capacitive coupling through first secondary winding 114 and second secondary winding 116. In a representative embodiment, the induced cross-talk current may be measured at nodes n2 and n4 by an ammeter or tester.

In step S3 of FIG. 2, resistance values of resistors 152, 154 and 156 of correction circuit 150 are determined based on the cross-talk current measured in step S2. In a representative embodiment, the correction (drive) voltage needed to reduce the cross-talk current is determined based on the measured cross-talk current, and resistance values of resistors 152, 154 and 156 in correction circuit 150 necessary to provide the correction voltage are selected.

In step S4, correction circuit 150 is configured to include resistors 152, 154 and 156 having the resistance values selected in step S3.

In step S5, correction circuit 150 as configured in step S4 is connected to first secondary winding 114, to generate the correction voltage responsive to the first complex waveform voltage. The correction voltage is connected to drive shield 118, which consequently induces a correction current in second secondary winding 116 to reduce cross-talk current induced between first secondary winding 114 and second secondary winding 116.

In a representative embodiment, the resistance values of resistors 152, 154 and 156 of correction circuit 150 may be determined in step S3 by building a physical model of apparatus 10 including first and second full wave bridge rectifiers 120 and 130, transformer 110 and correction circuit 150. With correction circuit 150 disabled as described previously, a corresponding voltage may be applied to primary winding 112 of the physical model, and the induced cross-talk current between first and second secondary windings 114 and 116 may be measured. The physical model of apparatus 10 may then be modified to enable correction circuit 150 with resistors 152, 154 and 156 having resistance values selected based on the measured cross-talk current. The corresponding voltage may then be applied to primary winding 112 of the modified physical model, and the induced cross-talk current of the modified physical model again measured. Operation of the modified physical model may be repeated using different resistance values until the measured induced cross-talk current is reduced or substantially eliminated. The corresponding resistance values used to reduce or substantially eliminate the induced cross-talk current may thus be selected as the actual resistance values of resistors 152, 154 and 156.

In a further representative embodiment, the resistance values of resistors 152, 154 and 156 of correction circuit 150 may be determined in step S3 by using a virtual model of apparatus 10 including first and second full wave bridge rectifiers 120 and 130, transformer 110 and correction circuit 150 created by computer simulation. With correction circuit 150 of the virtual model disabled as described previously, operation of the virtual model may be simulated by application of a corresponding voltage to primary winding 112 of the virtual model. The induced cross-talk current between first and second secondary windings 114 and 116 of the virtual model during simulated operation may be measured. The virtual model may then be modified to enable correction circuit 150 with resistors 152, 154 and 156 having resistance values initially selected based on the measured complex waveform voltage. Operation of the modified virtual model including correction circuit 150 may then be simulated by application of the corresponding voltage to primary winding 112 of the modified virtual model, and the induced cross-talk current of the modified virtual model again measured. Operation of the modified virtual model may be repeatedly simulated using different resistance values until the measured induced cross-talk current is reduced or substantially eliminated. The corresponding resistance values used during simulation to reduce or substantially eliminate the induced cross-talk current may thus be selected as the actual resistance values of resistors 152, 154 and 156.

In a representative embodiment, apparatus 10 may be a multi-meter such as a digital multi-meter. Apparatus 10 may be configured so that the rectified voltage (earth_dc_bias) at node n1 as referenced to earth ground may power the multi-meter panel, display, I/O connections and keyboard for example. The rectified voltage (floating_dc_bias) at node n3 may power the measurement leads to enable the floating measurement. The correction voltage generated by correction circuit 150 may drive shield 118, to reduce or substantially eliminate cross-talk current induced between first secondary winding 114 and second secondary winding 116, to consequently reduce or substantially eliminate unwanted current injection into the measurement powered by the rectified voltage (floating_dc_bias) at node n3.

In other representative embodiments, apparatus 10 may be medical device, tester or any other device configured to be powered by a rectified voltage generated by a transformer. Correction circuit 150 may generate a correction voltage to reduce or substantially eliminate cross-talk current induced between first secondary winding 114 and second secondary winding 116, to consequently reduce or substantially eliminate unwanted current injection into the medical device, tester or other device powered by the rectified voltage (floating_dc_bias) at node n3.

In a representative embodiment, during manufacture of apparatus 10, the resistance values of resistors 152, 154 and 156 may be determined as described with reference to step S3 of FIG. 2. Coffee ion circuit 150 may then be configured to include resistors 152, 154 and 156 having the selected resistance values as described with respect to step S4, and thus enabled for operation. Apparatus 10 as thus manufactured and configured may then be provided to an end user. Correction circuit 150 may then be operable to provide the correction voltage for reducing or substantially eliminating induced cross-talk current between first and second secondary windings 114 and 116 when apparatus 10 is powered up for operation when connected to the mains voltage by the end user.

Correction circuit 150 as shown in FIG. 1 includes resistors 152, 154 and 156 configured as a summing circuit to generate the correction voltage, without complex or expensive circuits and/or active circuits such as amplifiers. In a further representative embodiment, correction circuit 150 may be configured as including resistors 154 and 156 respectively connected to leads 101 and 103 of first secondary winding 114, without resistor 152. Correction circuit 150 of this further representative embodiment may be disabled by shorting it to ground at node n2 and by removing resistors 154 and 156. In other representative embodiments, correction circuit 150 may instead or also include passive components such as capacitors. The correction voltage may be generated by configuring at least one component of correction circuit 150 based on the measured induced cross-talk current, by adjusting a corresponding value of the at least one component for example, In apparatus 10 as shown in FIG. 1, the first complex waveform voltage at first secondary winding 114 as relative to earth ground at node n2 is greater than the second complex waveform voltage at second secondary winding 116 as relative to floating ground at node n4. The cross-talk current is thus induced from first secondary winding 114 into second secondary winding 116. The correction voltage from correction circuit 150 is connected to drive shield 118 to induce a correction current into second secondary winding 116 to reduce or substantially eliminate the induced cross-talk current.

In a further representative embodiment, apparatus 10 may be configured as shown in FIG. 1, except that node n2 may instead be connected to floating ground (floating_ground) so that the first complex waveform voltage at first secondary winding 114 is relative to floating ground. Also, node n4 may instead be connected to earth ground (earth_ground) so that the second complex waveform voltage at second secondary winding 116 is relative to earth ground. In this further representative embodiment, first full wave bridge rectifier 120 outputs rectified voltage (floating_dc_bias) at node n1 relative to floating ground at node n2, and second full wave bridge rectifier 130 outputs rectified voltage (earth_dc_bias) at node n3 relative to earth ground at node n4. The second complex waveform voltage at second secondary winding 116 as relative to earth ground at node n4 in this further representative embodiment is greater than the first complex waveform voltage at first secondary winding 114 as relative to floating ground at node n2. The cross-talk current is thus induced from second. secondary winding 116 into first secondary winding 114. The correction voltage from correction circuit 150 is connected to drive shield 118 to induce a correction current into second secondary winding 116 to reduce or substantially eliminate the induced cross-talk current.

While specific embodiments are disclosed herein, many variations are possible, which remain within the concept and scope of the present teachings. For example, full wave bridge rectifiers having different configurations and interconnections then as shown in FIG. 1 may be used to provide the rectified voltages and to create the first and second complex waveform voltages at first and second secondary windings 114 and 116. Apparatus 10 may include additional components not specifically shown, to provide synchronous rectification. Transformer 110 may include a plurality of primary windings. Although a single shield 118 is disposed between first and second secondary windings 114 and 116, additional shields may be disposed between primary winding 112 and either or both of first and second secondary windings 114 and 116. A shield may also be placed around primary winding 112. Also, the resistance values of resistors 152, 154 and 156 may be determined in step S3 using various algorithms. Such variations would be apparent in view of the specification, drawings and claims herein.

What is claimed is:

1. An apparatus comprising:
   a transformer comprising a primary winding, a first secondary winding configured to provide a first voltage responsive to a voltage applied to the primary winding, and a second secondary winding configured to provide a second voltage responsive to the voltage applied to the primary winding;
   a shield between the first and second secondary windings; and
   a correction circuit configured to generate a correction voltage responsive to the first voltage, wherein the correction voltage drives the shield to reduce cross-talk current induced between the first and second secondary windings.

2. The apparatus of claim 1, wherein the first secondary winding provides the first voltage relative to earth ground, and the second secondary winding provides the second voltage relative to floating ground.

3. The apparatus of claim 1, wherein the first secondary winding provides the first voltage relative to floating ground, and the second secondary winding provides the second voltage relative to earth ground.

4. The apparatus of claim 1, wherein the correction circuit comprises passive components.

5. The apparatus of claim 1, wherein the correction circuit comprises resistors having resistance values that are determined based on measurement of the cross-talk current induced between the first and second secondary windings.

6. The apparatus of claim 1, wherein the correction circuit is a summing circuit configured to sum voltages at first and second ends of the first secondary winding.

7. The apparatus of claim 1, further comprising:
a first full wave bridge rectifier connected to the first secondary winding and configured to generate the first voltage responsive to an output of the first secondary winding; and
a second full wave bridge rectifier connected to the second secondary winding and configured to generate the second voltage responsive to an output of the second secondary winding.

8. The apparatus of claim 1, wherein the first and second voltages comprise complex waveform voltages.

9. The apparatus of claim 1, wherein the voltage applied to the primary winding comprises a mains voltage.

10. The apparatus of claim 1, configured as a multi-meter.

11. An apparatus comprising:
a transformer comprising a primary winding, a first secondary winding configured to provide a first complex waveform voltage responsive to a voltage applied to the primary winding, and a second secondary winding configured to provide a second complex waveform voltage responsive to the voltage applied to the primary winding;
a shield between the first secondary winding and the second secondary winding; and
a correction circuit configured to generate a correction waveform voltage responsive to the first complex waveform voltage, wherein the correction waveform voltage drives the shield to induce a correction current in the second secondary winding to substantially cancel cross-talk current induced between the first and second secondary windings.

12. The apparatus of claim 11, wherein the first secondary winding provides the first complex waveform voltage relative to earth ground, and the second secondary winding provides the second complex waveform voltage relative to floating ground.

13. The apparatus of claim 11, wherein the first secondary winding provides the first complex waveform voltage relative to floating ground, and the second secondary winding provides the second complex waveform voltage relative to earth ground.

14. The apparatus of claim 11, wherein the correction circuit comprises passive components.

15. The apparatus of claim 11, wherein the correction circuit comprises resistors having resistance values that are determined based on measurement of the cross-talk current induced between the first and second secondary windings, 16. The apparatus of claim 11, wherein the correction circuit is a summing circuit configured to sum voltages at first and second ends of the first secondary winding.

17. The apparatus of claim 11, further comprising:
a first full wave bridge rectifier connected to the first secondary winding and configured to generate the first complex waveform voltage responsive to an output of the first secondary winding; and
a second full wave bridge rectifier connected to the second secondary winding and configured to generate the second complex waveform voltage responsive to an output of the second secondary winding.

18. The apparatus of claim 11, wherein the voltage applied to the primary winding comprises a mains voltage.

19. The apparatus of claim 11, configured as a multi-meter.

20. A method of providing a correction circuit for a transformer, the transformer comprising a primary winding, a first secondary winding, a second secondary winding, and a shield configurable to induce a current into the second secondary winding, the method comprising:
generating a first voltage from the first secondary winding and a second voltage from the second secondary winding, in response to application of a voltage to the primary winding;
measuring cross-talk current induced between the first and second secondary windings; and
configuring at least one component of the correction circuit based on the measured cross-talk current, the correction circuit being configured to receive the first voltage,
wherein the correction circuit is configured to provide a drive voltage that drives the shield in response to the first voltage to induce a correction current in the second secondary winding for reducing cross-talk current induced between the first and second secondary windings.

21. The method of claim 20, wherein the first voltage is generated relative to earth ground, and the second voltage is generated relative to floating ground.

22. The method of claim 20, wherein the first voltage is generated relative to floating ground, and the second voltage is generated relative to earth ground.

23. The method of claim 20, wherein the at least one component is a resistor, and said configuring comprises adjusting a resistance of the resistor.

24. The method of claim 23, wherein the resistance is determined by modeling the transformer using a simulator.

25. The method of claim 20, wherein said configuring comprises:
determining the drive voltage needed to reduce the measured cross-talk current; and
selecting a value of the at least one component to provide the drive voltage.

26. The method of claim 20, wherein the first and second voltages are complex waveform voltages.

* * * * *